(12) United States Patent
Leuzzi et al.

(10) Patent No.: US 9,252,744 B2
(45) Date of Patent: Feb. 2, 2016

(54) LOW-NOISE ELECTRONIC CIRCUIT SIMULATING THE BEHAVIOR OF AN INDUCTANCE

(71) Applicant: Universita' Degli Studi Dell'Aquila, L'Aquila (IT)

(72) Inventors: Giorgio Leuzzi, L'Aquila (IT); Vincenzo Stornelli, L'Aquila (IT); Paolo Colucci, L'Aquila (IT); Leonardo Pantoli, L'Aquila (IT)

(73) Assignee: Universita' Degli Studi Dell'Aquila, L'Aquila (IT)

( * ) Notice: Subject to any disclaimer, the term of this patent is extended or adjusted under 35 U.S.C. 154(b) by 28 days.

(21) Appl. No.: 14/301,526

(22) Filed: Jun. 11, 2014

(65) Prior Publication Data

US 2014/0292448 A1    Oct. 2, 2014

Related U.S. Application Data

(63) Continuation of application No. PCT/IB2012/057173, filed on Dec. 11, 2012.

(30) Foreign Application Priority Data

Dec. 12, 2011 (IT) .......................... MI2011A002243

(51) Int. Cl.
    *H03H 11/48*    (2006.01)
(52) U.S. Cl.
    CPC ........... *H03H 11/485* (2013.01); *H03H 11/486* (2013.01)
(58) Field of Classification Search
    CPC ........................................ H03H 11/48–11/50
    USPC ................................................. 333/213–216
    See application file for complete search history.

(56) References Cited

U.S. PATENT DOCUMENTS

| 6,515,560 B1 * | 2/2003 | Adan ...................... H03H 11/48 333/214 |
| 6,737,944 B2 * | 5/2004 | Kunikiyo ............... H03H 11/48 333/214 |

(Continued)

FOREIGN PATENT DOCUMENTS

JP    57-37808 A    3/1982

OTHER PUBLICATIONS

S. Del Re et al., "A New Approach to the Design of High Dynamic Range Tunable Active Inductors", Integrated Nonlinear Microwave and Millimetre-Wave Circuits, 2008, Nov. 24, 2008, pp. 25-28.

(Continued)

*Primary Examiner* — Dean Takaoka
*Assistant Examiner* — Alan Wong
(74) *Attorney, Agent, or Firm* — Dickstein Shapiro LLP

(57) ABSTRACT

An electronic circuit simulating the behavior of an inductance between a respective input node and a reference potential. The electronic circuit comprises a compensation network electrically connected between ground and a source potential and an inverting amplification stage electrically connected to the output of the compensation network. The inverting amplification stage comprises a transistor having a control terminal connected to the input of the inverting amplification stage, a first bias terminal operatively connected to the output of the inverting amplification stage, and a second bias terminal operatively connected to ground. The inverting amplification stage further comprises a feedback capacitance interposed between the first bias terminal and the control terminal of the transistor, and a feedback inductance interposed between the second bias terminal of the transistor and ground.

8 Claims, 5 Drawing Sheets

(56) References Cited

U.S. PATENT DOCUMENTS

| | | | | |
|---|---|---|---|---|
| 7,020,450 B2* | 3/2006 | Desclos | ............... | H03H 11/48 327/113 |
| 7,042,317 B2* | 5/2006 | Xiao | ................ | H03H 11/486 330/257 |
| 7,453,315 B2* | 11/2008 | Ravezzi | ................ | H03F 1/42 327/427 |
| 8,115,575 B2* | 2/2012 | Hsu | ................ | H03H 11/08 333/214 |
| 2007/0257748 A1* | 11/2007 | Kawai | ................ | H03H 11/48 333/214 |

OTHER PUBLICATIONS

David Barras et al., "A Low Supply Voltage SiGe LNA for Ultra-Wideband Frontends", IEEE Microwave and Wireless Components Letters, vol. 14, No. 10, Oct. 1, 2004, pp. 469-471.

Chang-Wan Kim et al., "An Ultra-Wideband CMOS Low Noise Amplifier for 3-5-$GH_z$ UWB System", IEEE Journal of Solid-State Circuits, vol. 40, No. 2, Feb. 1, 2005, pp. 544-547.

* cited by examiner

LOW-NOISE ELECTRONIC CIRCUIT SIMULATING THE BEHAVIOR OF AN INDUCTANCE

This is a continuation of International Application No. PCT/IB2012/057173, filed on Dec. 11, 2012, which claims priority to Italian Application No. MI2011A002243, filed on Dec. 12, 2011, the disclosures of which are herein incorporated by reference in their entireties.

BACKGROUND OF THE INVENTION

1. Field of the Invention

The present invention relates to an active inductor, i.e., an electronic circuit simulating the behaviour of an inductance by using only suitably biased active components, capacitors and resistors.

2. Description of the Related Art

An active inductor is, as such, an inherently noisy circuit, which therefore would not be suitable to process signals with very low power, since the signal/noise ratio would be excessively degraded by the processing itself.

A first type of prior art active inductors consists of impedance simulators using operational amplifiers (OPAMPs), transconductance amplifiers (OTAs), or current conveyors (CCs) as active components. This type of active inductors has maximum operating frequencies of a few MHz, and it is especially used in low and very low frequency applications.

In order to obviate this limitation in frequency, a second type of active inductors of a known type has been developed, in which such active inductors are mostly implemented in CMOS technology. This type of active inductors is characterized by higher operating frequencies (up to some GHz), but it is often characterized by a high parasitic series resistance that, in order to reduce losses, is controlled by circuits referred to as NICs (Negative Impedance Circuits). Such circuits implement methods that make the inductance variable by changing the gain of the active elements composing the inductor by varying the biasing conditions thereof. This class of active inductors is characterized by low losses, by virtue of the use of NIC circuits; however, the methods that are used to implement the inductance variability cause a high distortion already at very low powers. Therefore, such active inductors cannot be used in processing signals having the powers generally used in radio-frequency transmissions, thus they are suitable only to process signals with a power in a very narrow range.

In order to obviate this drawback, a third type of active inductors has been developed, which is composed of active inductors having an inductance with fixed value, which use phase compensation networks in order to reduce series resistance. This type of active inductors, combined with the use of transistors (for example, of the BJT type) as active elements, is potentially capable to process high signal powers with low distortion. However, as it is known, in a tunable filter consisting of inductances and capacitances, the variation in the center frequency, while keeping a given Q factor (Quality factor), requires varying at the same time both the inductances and the capacities composing the filter. This is not possible with the inductors of such third class, since they are devices characterized by a preset inductance.

Furthermore, it is noticed that each of the types of active inductors of the described prior art has also a rather high noise figure.

SUMMARY OF THE INVENTION

The object of the present invention is to provide an active inductor, i.e., an electronic circuit simulating the behavior of an inductance, which allows at least partially obviating the drawbacks set forth above with reference to the prior art, while ensuring a low noise.

Such an object is achieved by an electronic circuit simulating the behavior of an inductance as claimed and described herein.

Preferred embodiments of such electronic circuit are defined in the appended dependent claims.

BRIEF DESCRIPTION OF THE DRAWINGS

Further characteristics and advantages of the electronic circuit according to the invention will be apparent from the description set forth below of preferred exemplary embodiments, given by way of indicative, non-limiting example, with reference to the appended Figures, in which.

DETAILED DESCRIPTION OF THE PREFERRED EMBODIMENTS

With reference to the above-mentioned figures, an electronic circuit simulating the behaviour of an to inductance has been generally indicated by 100, herein below, simply referred to as an electronic circuit, according to an example of the invention.

Figure 1:
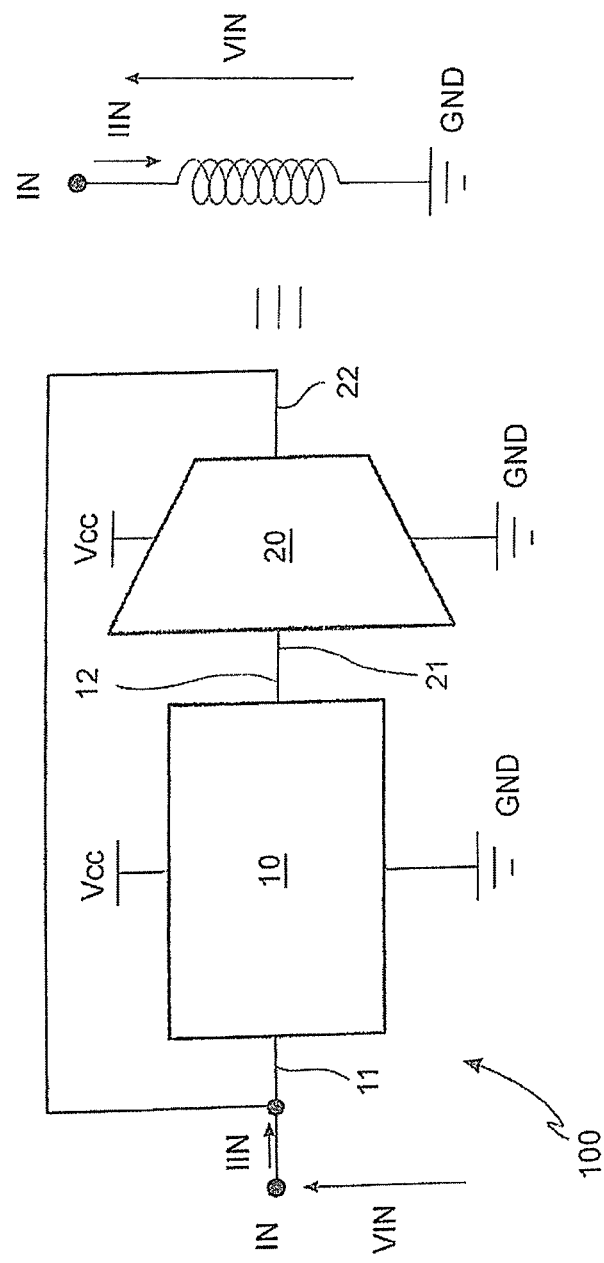
FIG. 1 illustrates a block diagram of the electronic circuit simulating the behaviour of an inductance according to an example of the invention.

With reference to the block diagram of FIG. 1, the electronic circuit 100 of the described example simulates the behaviour of an inductance L between a respective input node IN and a reference potential GND, for example, the ground potential. The inductance L has a respective input current IIN and a respective output voltage VIN.

The electronic circuit 100 comprises an compensation network 10 having a respective input terminal 11 electrically connected to the input node IN of the electronic circuit 100, and a respective output terminal 12.

The compensation network 10 is electrically connected between the reference potential GND and a further reference potential VCC, for example, the supply potential of the electronic circuit 100.

The compensation network 10, described in detail herein below, preferably is an electronically variable passive compensation network.

Again with reference to the block diagram of FIG. 1, the electronic circuit 100 further comprises an inverting amplification stage 20 having a respective input terminal 21 that is electrically connected to the output terminal 12 of the compensation network 10, and a respective output terminal 22 that is electrically connected to the input node IN of the electronic circuit 100.

The inverting amplification stage 20, described in detail herein below, is electrically connected between the further reference potential VCC and the reference potential GND.

Figure 2:
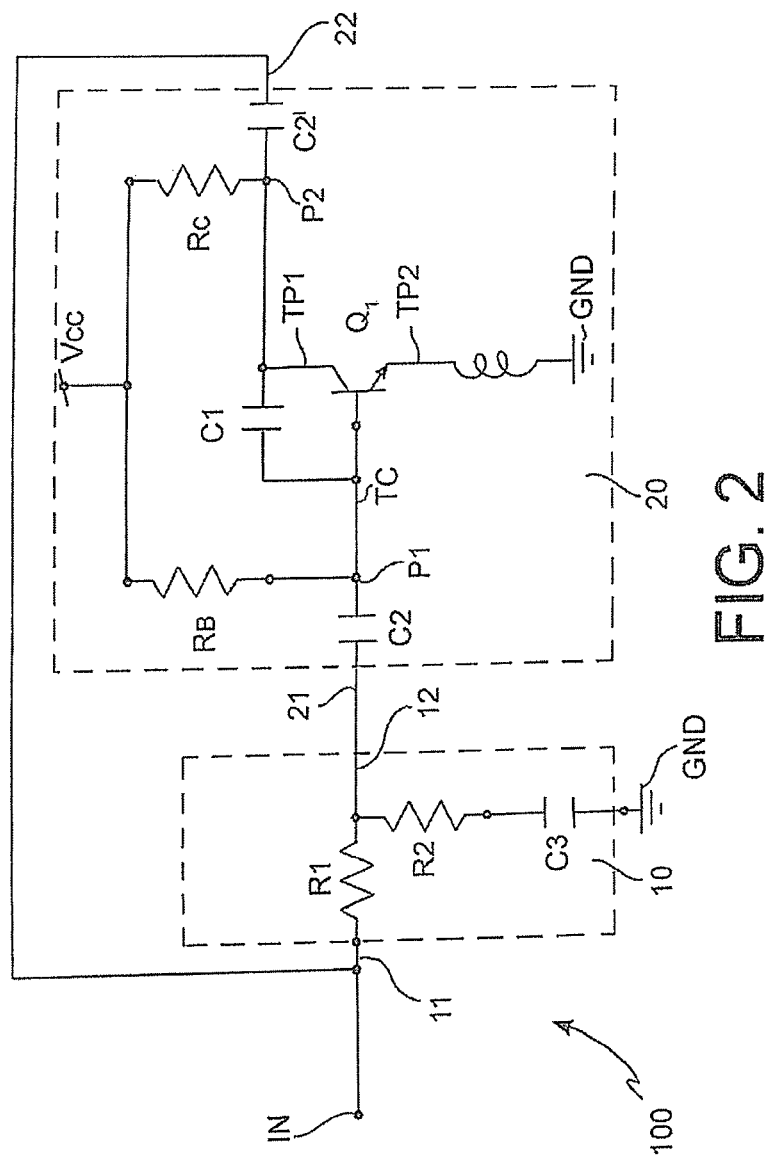
FIG. 2 illustrates in a circuital view the electronic circuit according to an example of the invention.

With reference to the FIG. 2, in a circuital view the electronic circuit 100 according to an example of the invention will be now described in more detail.

The inverting amplification stage 20 is, for example, a transadmittance inverting amplifier comprising high-linearity active elements, such as, for example, transistors for medium or high power applications. Such active elements advantageously allow the electronic circuit 100 to reach high ranges of input voltage VIN and input current IIN with low noise, up to relatively high powers.

In more detail, the inverting amplification stage 20 comprises a transistor Q1 having a control terminal TC operatively connected to the input terminal 21 of the inverting amplification stage 20, a first bias terminal TP1 operatively connected to the output terminal 22 of the inverting amplification stage 20, a second bias terminal TP2 operatively connected to the reference potential GND.

According to the example of FIG. 2, the transistor Q1 of the inverting amplification stage 20 is a bipolar transistor in a common emitter configuration, in which the control terminal TC is the base terminal, the first bias terminal TP1 is the collector terminal, and the second bias terminal TP2 is the emitter terminal. The common emitter configuration allows the transadmittance inverting amplification stage 20 to have moderate input impedance, high output impedance, high gain characterized by a dominant low-frequency pole.

According to a further example of the invention (not shown in the Figures), the transistor Q1 of the inverting amplification stage 20 can be a field effect transistor (MOS), more particularly a HEMT (High Electron Mobility Transistor) or a HFET (Heterostructure FET) transistor, in which the control terminal TC is the gate terminal, the first bias terminal TP1 corresponds to the drain terminal, and the second bias terminal TP2 corresponds to the source terminal, or vice versa, according to the fact that the MOS transistor is a N-channel or a P-channel transistor.

Referring back generally to the electronic circuit of FIG. 2 example, the inverting amplification stage 20 comprises a feedback capacitance C1 interposed between the first bias terminal TP1 and the control terminal TC, respectively, of the transistor Q1, and a feedback inductance L1 interposed between the second bias terminal TP2 of the transistor Q1 and the reference potential GND.

The feedback capacitance C1 and the feedback inductance L1 of the transistor Q1 advantageously allow compensating the thermal noise that normally the transistor Q1 has. In such a manner, it is possible to decrease the order of magnitude of the electronic circuit 100 noise compared to the conventional active inductors, such as those of the described prior art.

Particularly, the feedback capacitance C1 and the feedback inductance L1 allow making the inverting amplification stage 20 "cold", i.e., having a low noise figure, at the frequencies at issue, while providing to the same inverting amplification stage 20 the correct load impedance in order to have a low noise.

Referring back to the FIG. 2 example, the inverting amplification stage 20 comprises a biasing network RB, RC, C2, C2' of the transistor Q1.

The biasing network RB, RC, C2, C2' of the transistor Q1 comprises, for example:

a first biasing resistor RB electrically interposed between the control terminal TC and the further reference potential VCC. The first biasing resistor RB is electrically connected to the control terminal TC of the transistor Q1 at a first biasing node P1 of the transistor Q1;

a second biasing resistor RC electrically interposed between the first bias terminal C and the further reference potential VCC. The second biasing resistor RC is electrically connected to the first bias terminal C of the transistor Q1 at a second biasing node P2 of the transistor Q1;

a first biasing capacitance C2 electrically interposed between the first biasing node P1 of the transistor Q1 and the input terminal 21 of the inverting amplification stage 20;

a second biasing capacitance C2' electrically interposed between the second biasing node P1 of the transistor Q1 and the output terminal 22 of the inverting amplification stage 20.

Referring back generally to the electronic circuit 100 of the FIG. 2 example, the compensation network 10 is an electronically variable passive network having a output voltage-input voltage ratio variable both in amplitude and in phase by means of tunable components.

The compensation network 10 of FIG. 2 comprises:

a first compensation resistor R1 electrically interposed between the input terminal 11 and the output terminal 12 of the compensation network 10;

a second compensation resistor R2 and an compensation capacitance C3 electrically connected in series with each other between the output terminal of the biasing network 10 and the reference potential GND (for example, the ground potential).

According to another exemplary embodiment, not shown in the Figures, the compensation network 10 can be an RC-type compensation network. In other embodiments, also not shown in the figures, the tunable elements of the compensation network can comprise elements such as FETs, which are used in a "cold" mode, i.e., free from the bias at the drain terminal, and which are used as resistors between the source and drain terminals, with the gate terminal voltage acting as a control voltage for the channel resistance, and furthermore, inversely biased "varicap" diodes, the capacitance of which is controlled by the biasing voltage itself.

In the absence of reactive effects, such an compensation network behaves as a positive resistor with a value equal to the inverse of the total transconductance of the inverting amplification stage, assuming the input impedance of the amplification stage itself as high.

In order to achieve an inductive behaviour, it is necessary to introduce a n/2 phase shift between the output current and the input voltage.

This phase shift is obtained by combining the effects of the amplifier dominant pole and the suitable filtering behaviour of the compensation network.

At phase shifts of less than or exceeding n/2, a behaviour equivalent to an inductor in series with a positive or negative resistor, respectively, is obtained. The latter type of behaviour is preferably to be avoided, in order to achieve a stable behaviour of the active inductor.

The compensation network 10 performs two functions: on one hand, it controls the total transadmittance gain value, in order to vary the equivalent inductance value; on the other hand, it changes the phase of the output current relative to the input voltage, to keep the value of the equivalent series resistance always positive, and small in the band of interest.

Both "cold" FETs and varicaps are sufficiently linear elements for the applications of interest, above all when considered the small currents flowing in the network, due to its high impedance.

The desired behaviour is usually obtained, i.e., an inductive behaviour with a reduced (positive) series resistance, only in a limited frequency band; for all the other frequencies, a series resistance value that is always positive and higher is obtained.

This behaviour is highly advantageous in case the active inductor is used to implement highly selective tunable band-pass filters. However, the above-mentioned application is also one of the most interesting industrially.

Figure 5:
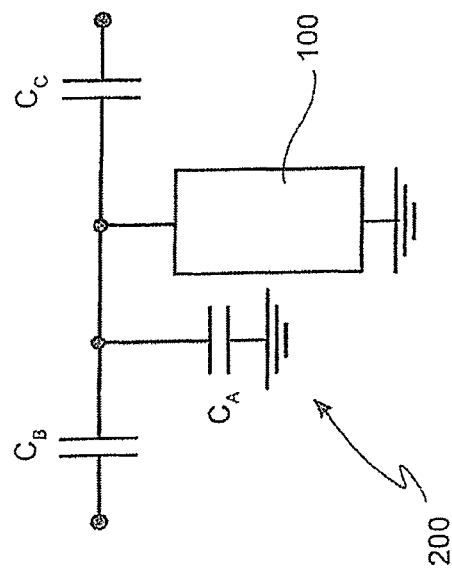
FIG. 5 illustrates in a circuital view an example of application of the electronic circuit according to the example of FIG. 2.

In this regard, an example of a circuit scheme for a band-pass filter 200 employing a first order low-noise active inductor, which can be simulated with the electronic circuit 100 of the described example of the invention, is illustrated in FIG. 5. In such a band-pass filter LC (inductance-capacitance), the inductor has been replaced by an active inductor according to the present invention, indicated again by the numeral reference 100 in FIG. 5.

The inverting amplification stage 20 is preferably implemented, as stated before, by employing, for example, a BJT or HEMT transistor, i.e., a high-linearity active element for medium or high power applications. This active element allows wide ranges of input voltage and current with low distortion, up to relatively high powers.

In order to reduce the supply power dissipation, the active component (transistor Q1) of the inverting amplification stage 20 is biased up to class AB, i.e., with moderate biasing currents.

The power levels that can be obtained without distortion and the power consumption depend on the circuit options. For example, a P1 dB (compression point of the gain at 1 dB) of at least 0 dBm can be obtained with a 5V supply voltage and a power consumption of less than 10 mW by using a silicon BJT transistor. Similarly, the noise figure that can be obtained depends on the technology used and the circuit options, but it is generally similar to that of a normal amplification stage; for example, about 2 dB of noise figure can be achieved at 1 GHz with a silicon BJT technology.

However, the implementation technology is not crucial; yet it is important that the used devices have a high linearity. Therefore, at high frequencies (typically exceeding 1 GHz), a GaAs-based HEMT, or a SiGe-based HBT technology is, for example, preferable. At lower frequencies, a less expensive silicon BJT technology can be used. A silicon CMOS technology has generally not the suitable linearity for this kind of circuit, but it can be tolerable for low operative powers (e.g., P1 dB lower than −30 dBm).

If the active component and the constructive technology are suitable, the electronic circuit 100 according to the present invention can operate at radiofrequencies, microwaves, up to milliwaves.

Figure 3:
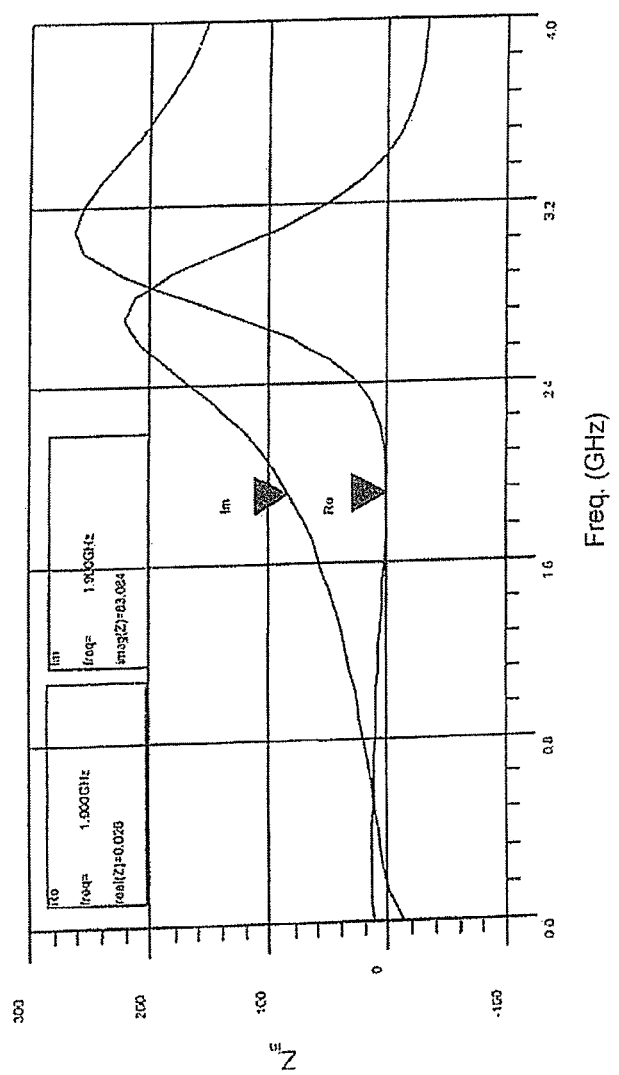
FIG. 3 illustrates the real part and the imaginary part of the input impedance of the electronic circuit of the example of FIG. 2.

In FIG. 3, the measurement in terms of the real and imaginary parts of the frequency response of the input impedance $Z_{in}$ of the low-noise active inductor simulated with the electronic circuit 100 of FIG. 2 is shown.

It shall be noticed that the imaginary part of the input impedance $Z_{in}$ has a typical inductive trend in a high frequency range, while the real part of the input impedance $Z_{in}$ has a substantially null trend only in a narrow frequency range.

In such a frequency range, the real part of the input impedance $Z_{in}$ of the active inductor approaches zero. This means that the Q factor (Quality factor) of the active inductor is very high, i.e., the active inductor has low-noise behaviour.

Figure 4:
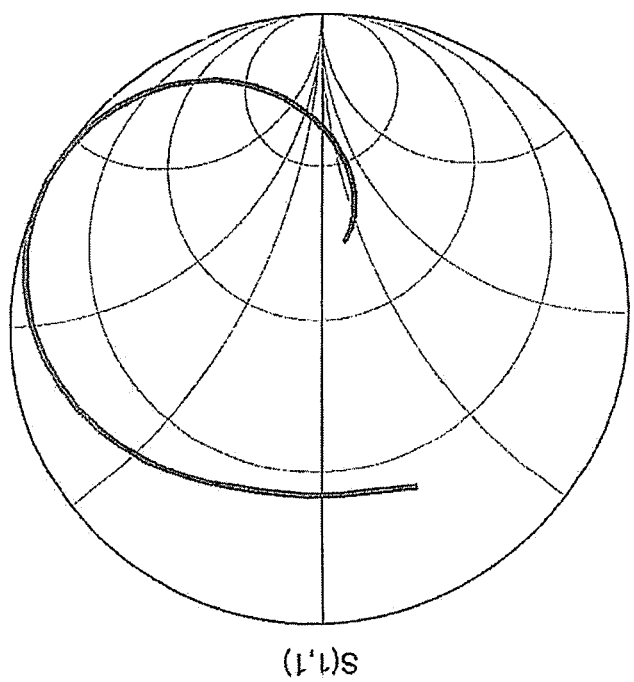
FIG. 4 illustrates a Smith chart of the complex impedance of the electronic circuit of FIG. 2.

In FIG. 4, by a Smith chart graphical aid, the (complex) reflection coefficient of the active inductance simulated by the electronic circuit 100 is illustrated. The illustration of FIG. 4 is consistent with what has been illustrated and described above with reference to FIG. 3.

As it can be noticed, the object of the invention is fully achieved, since the feedback capacitance and the feedback inductance that are present on the transistor Q1 of the inverting amplification stage 20 of the electronic circuit 100 (simulating the active inductor) allow obtaining the correct load impedance to provide the active inductor with minimum noise.

Furthermore, the described electronic circuit advantageously allows using AB-class stages with a consequent decrease of the dissipated power.

In addition, the electronic circuit of the invention allows tuning the active inductor by using only electronically variable passive linear networks, implemented, for example, by FETs in the Ohmic region and varicap diodes.

Also, the electronic circuit of the invention allows varying both the series inductance and resistance and achieving the maximum power of the input signal to the active inductor, independently from the inductance value associated to the active inductor.

Finally, the electronic circuit of the invention allows obtaining a low distortion for high signal powers.

Furthermore, although hitherto, the electronic circuit can be both produced on printed circuit board with discrete components and easily manufactured in a monolithic technology.

As regards the fields of application, the electronic circuit of the invention may find widespread, advantageous use in a number of fields, such as telecommunications, radio surveillance, aerospace, mobile telephony, radio mobile and static apparatuses, radar apparatuses, jammers, tuning circuits, and so on.

To the above-described embodiments of the electronic circuit, one of ordinary skill in the art, in order to meet contingent needs, will be able to make modifications, adaptations, and replacements of elements with functionally equivalent other ones, without departing from the scope of the following claims. Each of the characteristics described as belonging to a possible embodiment can be implemented independently from the other embodiments described.

What is claimed is:

1. An electronic circuit simulating the behavior of an inductance between a respective input node and a reference potential, said electronic circuit comprising:
   a compensation network having a respective input terminal electrically connected to the input node of the electronic circuit and a respective output terminal, said compensation network being electrically connected between said reference potential and a further reference potential;
   an inverting amplification stage having a respective input terminal electrically connected to the output terminal of the compensation network, and a respective output terminal electrically connected to the input node of the electronic circuit, said inverting amplification stage being electrically connected between the further reference potential and the reference potential,
   said inverting amplification stage comprising a transistor having a control terminal operatively connected to the input terminal of the inverting amplification stage, a first bias terminal operatively connected to the output terminal of the inverting amplification stage, a second bias terminal operatively connected to the reference potential;
   wherein said inverting amplification stage comprises a feedback capacitance interposed between the first bias terminal and the control terminal, respectively, of the transistor, and a feedback inductance interposed between the second bias terminal of the transistor and the reference potential.

2. The electronic circuit according to claim 1, further comprising a biasing network of the transistor.

3. The electronic circuit according to claim 2, in which the biasing network comprises:

a first biasing resistor electrically interposed between the control terminal of the transistor and the further reference potential, the first biasing resistor being electrically connected to the control terminal of the transistor at a first biasing node of the transistor;

a second biasing resistor electrically interposed between the first bias terminal and the further reference potential, the second biasing resistor being electrically connected to the first bias terminal of the transistor at a second biasing node of the transistor;

a first biasing capacitance electrically interposed between the first biasing node of the transistor and the input terminal of said inverting amplification stage;

a second biasing capacitance electrically interposed between the second biasing node of the transistor and the output terminal of said inverting amplification stage.

4. The electronic circuit according to claim 1, wherein the compensation network comprises:

a first compensation resistor electrically interposed between the input terminal and the output terminal of the compensation network;

a second compensation resistor and an compensation capacitance electrically connected in series with each other between the output terminal of the biasing network and the reference potential.

5. The electronic circuit according to claim 1, wherein the compensation network is of the RC type.

6. The electronic circuit according to claim 1, wherein the compensation network comprises FET transistors that are used in a "cold" mode, and inversely biased "varicap" diodes.

7. The electronic circuit according to claim 1, wherein the transistor is a BJT transistor.

8. The electronic circuit according to claim 1, wherein the transistor is a HEMT or HFET transistor.

\* \* \* \* \*